MICROWAVE OSCILLATOR WITH PLURAL IMPATT DIODES

Filed Dec. 29, 1967

INVENTORS J. G. JOSENHANS
F. M. MAGALHAES
W. O. SCHLOSSER
BY
R. B. Anderson
ATTORNEY United States Patent Office 3,460,055

Patented Aug. 5, 1969

3,460,055
MICROWAVE OSCILLATOR WITH PLURAL IMPATT DIODES

James G. Josenhans and Frank M. Magalhaes, Berkeley Heights, and Wolfgang O. Schlosser, Basking Ridge, N.J., assignors to Bell Telephone Laboratories, Incorporated, Murray Hill and Berkeley Heights, N.J., a corporation of New York Filed Dec. 29, 1967, Ser. No. 694,463
Int. Cl. H03b 5/18, 7/12
U.S. Cl. 331—96 7 Claims

ABSTRACT OF THE DISCLOSURE

A plurality of IMPATT diodes are series connected within a microwave resonator. Each diode is separately mounted by a beryllium oxide annulus. The distances between successive diodes are within the ranges of $$\left(0 \text{ to } \tfrac{1}{8}\lambda,\ \tfrac{3}{8}\lambda \text{ to } \tfrac{5}{8}\lambda,\ \tfrac{7}{8}\lambda \text{ to } \tfrac{9}{8}\lambda \ldots \frac{3+4n}{8}\lambda \text{ to } \frac{5+4n}{8}\lambda\right)$$

Figure 1:
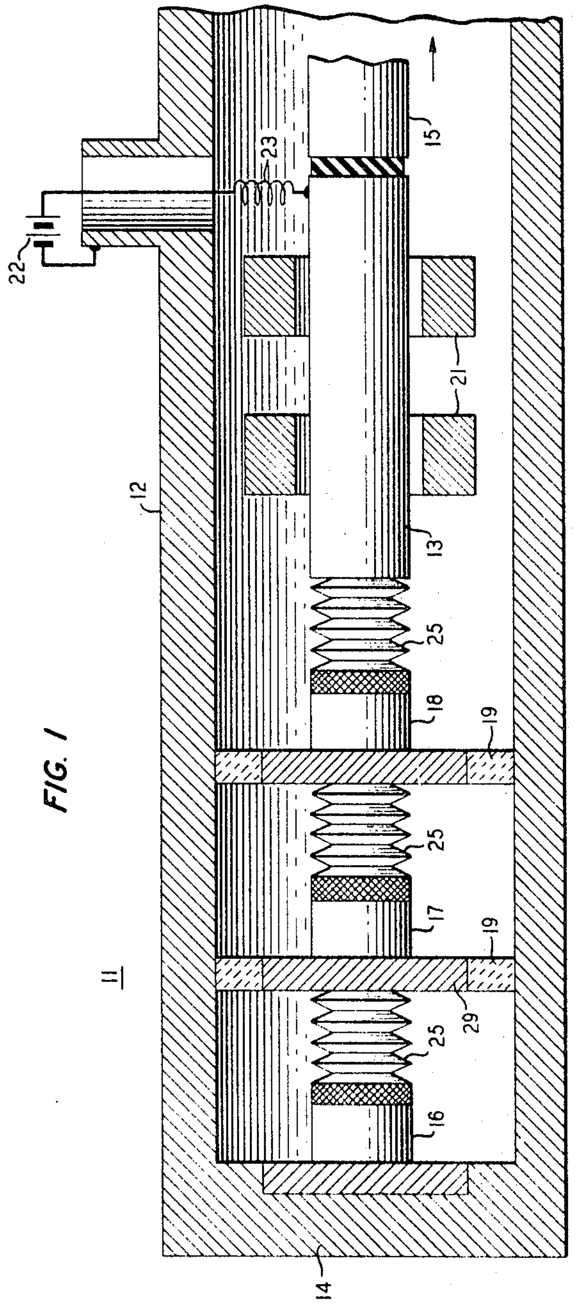

where λ is the wavelength of the frequency of operation of the oscillator and $n$ is an integral number.

Background of the invention

The patents of W. T. Read, Jr., No. 2,899,646 and B. C. de Loach, Jr., et al. No. 3,270,293, describe high frequency negative dynamic resistance diodes of the type now generally known as "IMPATT" diodes, which is an acronym for *imp*act *a*valanche and *t*ransit *t*ime. The paper "Recent Advances in Solid State Microwave Generators," by B.C. de Loach, Jr., Advances in Microwaves, vol. 2, 1967, Academic Press, Incorporated, New York, gives a qualitative description of IMPATT diode oscillators along with a comparison of their advantages with other solid state oscillators. The paper points out that the IMPATT diode promising source of fairly high power microwave energy, that is, electromagnetic wave energy having frequencies in excess of about 1 gigahertz ($10^9$ cycles per second).

Briefly, an IMPATT diode is a semiconductor diode having a p–n junction and a current transit region included between opposite contacts. An applied direct-current voltage biases the junction to avalanche breakdown, thereby creating current pulses each of which travels across the transit region within a prescribed time period. The transit time in the diode is arranged with respect to the resonant frequency of an external resonator such that radio-frequency voltages at the diode terminals are 180 degrees out of phase with the current pulses in the diode. Consequently, at appropriate applied frequencies, the current through the terminals increases as the terminal voltage decreases, thus meeting the conditions for negative resistance. Ultimately, part of the direct-current energy applied to the diode is converted to radio-frequency energy in the resonator and the circuit constitutes an efficient solid state microwave source.

As is true of other negative resistance diodes such as tunnel diodes and Gunn-effect diodes, the IMPATT diode is susceptible to overheating and may burn out if operated at high power levels for more than extremely short periods of time. A related restriction is that the product of power and impedance of the diode is inversely proportional to the square of the operating frequency, which limits the choice of load impedance at a given operating frequency as well as the choice of power level. As is clear from the De Loach paper, a major goal in the semiconductor art has been to devise a solid state microwave source which is capable of operating continuously at both high frequency and high power levels.

Accordingly, considerable effort has been expended in attempting to combine the radio frequency outputs of several IMPATT diodes. The paper "Frequency Locking and Modulation of Silicon Avalanche Diode Oscillators" by H. Fukui, Proceedings of the IEEE, October 1966, pages 1475–1477, describes how the outputs of eight independent oscillators can be combined through the use of hybrid circuits. The paper Composite Avalanche Diode Structures for Increased Power Capabilities," by C. B. Swan et al., IEEE Transaction on Electron Devices, ED–14, September, 1967, pages 584–589, describes how a plurality of IMPATT diodes can be connected in parallel and mounted on a single copper stud to operate together as a single oscillator. The Swan et al. oscillator, however, inherently has a low impedance level which decreases its efficiency and complicates circuit design, and since the diodes must be closely interconnected, the heat sinking capability of each individual diode is limited. The hybrid circuits of Fukui become increasingly complicated as the number of oscillators to be combined increases.

Summary of the invention

We have found that a plurality of IMPATT diodes can be connected in series within a microwave cavity resonator and can be spaced for enough apart to permit independent heat sinking of each individual diode. To be more explicit, we have found that IMPATT diodes can be connected in series with a single direct current bias source and can be separated by distances within the ranges of $$\left(0 \text{ to } \tfrac{1}{8}\lambda,\ \tfrac{3}{8}\lambda \text{ to } \tfrac{5}{8}\lambda,\ \tfrac{7}{8}\lambda \text{ to } \tfrac{9}{8}\lambda \ldots \frac{3+4n}{8}\lambda \text{ to } \frac{5+4n}{8}\lambda\right)$$

where λ is the wavelength of the frequency of operation of the oscillator and $n$ is an integral number. For example, the diodes may be spaced apart by distances equal to ⅜ λ to ⅝ λ, or ⅞ λ to 9/8 λ.

These rather wide spacings permit each diode to be mounted separately within the cavity resonator by annular members which conduct heat from the diode to the resonator but which electrically insulate the diode from the resonator. The output power of all of the diodes is combined by the resonator and can be delivered to a load as a single coherent microwave output. Hence, although the power-impedance product of each diode may vary inversely as the square of the frequency of operation, the power of the entire oscillator depends upon the number of diodes that are used, thus substantially increasing the freedom of choice in the design of microwave power sources. Further, the designer has a greater choice of net oscillator impedance at given frequency and power conditions.

Drawing description

Figure 2:
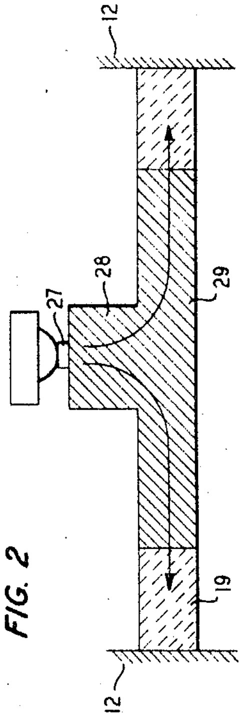

These and other objects, features, and advantages of the invention will be better understood from a consideration of the following detailed description taken in conjunction with the accompanying drawing in which:

FIG. 1 is a partially schematic view of an oscillator using series connected IMPATT diodes in accordance with an illustrative embodiment of the invention; and FIG. 2 is a sectional view of one of the diodes and diode mountings of the oscillator of FIG. 1.

Detailed description

Referring now to FIG. 1, there is shown a microwave oscillator 11 in accordance with an an illustrative embodiment comprising a cylindrical outer conductor 12 surrounding an inner conductor 13. The outer and inner conductors form a coaxial cable section which is terminated by an end wall 14 and is coupled to a coaxial cable output transmission line having an inner conductor 15. Three IMPATT diode oscillator packages 16, 17, and 18 are included between the terminating wall 14 and the inner conductor 13. The diode package 16 is mounted directly on the terminating wall 14 while the diode packages 17 and 18 are mounted on the outer conductor 12 by electrically insulative mounting rings 19. The volume enclosed by outer conductor 12 and terminating wall 14 constitutes a cavity resonator, the resonant frequency of which can be modified in a known manner by axially moving tuning rings 21.

The diode packages are connected in series to a direct current bias source 22 by way of the inner conductor 13, a radio frequency choke 23, the outer conductor 12 and the end wall 14. Conductive bellows 25 interconnect to diode packages to complete the direct current circuit. Each of the bellows constitutes a spring which facilitates successive mounting of the diodes in the resonant cavity and ensures good electrical contact.

As shown in FIG. 2, each diode package includes an IMPATT diode 27 mounted on a conductive stud 28 which includes a cylindrical base portion 29. The mounting ring 19 is made of an electrically insulative and thermally conductive material such as beryllium oxide, which provides a path for heat flow from the diode 27 to the outer conductor 12 as shown by the arrows. The provision of separate low thermal impedance heat paths for each of the IMPATT diodes is an important feature of the invention because, as mentioned above, the power lovel of an IMPATT diode oscillator is limited largely by its thermal dissipation capacity.

Each of the IMPATT diodes contained within diode packages 16, 17, and 18 is constructed in a known manner; that is, each diode has a p–n junction and a current transit region the length of which is chosen with respect to the operating frequency to give current pulses at the diode terminals that are approximately 180 degrees out of phase with respect to the radio-frequency voltage at those same terminals, thereby giving a net negative resistance. Only the diode package 16, however, is mounted in the cavity resonator in a conventional manner. The diode packages 17 and 18, unlike conventional structures, are mounted a substantial electrical distance from end wall 14, and preferably, an integral number of half wavelengths from end wall 14.

The device is caused to oscillate merely by applying the direct current voltage across the series connected diode packages as described before. Inevitable current transients and noise fluctuations excite R-F currents in the resonator which result in applied R-F voltages across the diodes. Due to the negative resistance of the diodes, these R-F voltages build up and are transmitted along the coaxial cable as shown by the arrow of FIG. 1 to an appropriate load. The inner conductor 15 of the output transmission line is insulated from inner conductor 13 of the resonator to isolate the D-C current and restrict it to the path described before. The beryllium oxide mounting rings 19 are of course permeable to electro-magnetic waves so that the entire unit shown acts as a single cavity resonator. It can be shown that, with the diode packages properly mounted, the output power generated by each of the diodes is added in phase to that of the other diodes, and the total output power is substantially equal to the output power that can be attained by one diode multipled by the number of diodes in the resonator.

Our analysis of IMPATT diode oscillators shows that for optimum efficiency an IMPATT diode must be located within one-eighth of a wavelength of a current maximum in the resonator. In a resonator of the type shown in FIG. 1, a current maximum occurs at the end wall 14 and at each half wavelength in an axial direction therefrom. Hence, the diode of package 16 should be located within one-eighth wavelength of the end wall 14 and diodes 17 and 18 should be within one-eighth of a wavelength of being an integral number of half wavelengths from the end wall 14. Another way of stating that the diodes should be located near a current maximum in a cavity resonator is that they should be located at distances D from the end wall which are within the ranges given by, therefor $$D=\left(0 \text{ to } \tfrac{1}{8}\lambda,\ \tfrac{3}{8}\lambda \text{ to } \tfrac{5}{8}\lambda,\ \tfrac{7}{8}\lambda \text{ to } \tfrac{9}{8}\lambda \ldots \frac{3+4n}{8}\lambda \text{ to } \frac{5+4n}{8}\lambda\right)$$

If one of the three illustrative diodes is located outside the above ranges of values, its output power will be drastically reduced. At typical microwave frequencies, the diode 17 may be mounted one-half wavelength from the end wall 14, with the diode 18 mounted a full wavelength from the end wall 14. The separation between successive diodes is thus sufficient to permit separate heat sinking of each diode as is required for highest power operation.

In summary, our improved oscillator results from our discovery that IMPATT diodes can be connected in series to a common bias source rather than being separately biased, and that, even though located in a single cavity resonator, they can be separated by sufficiently large electrical distances to permit separate heat sinking. In the preferred embodiment, the diodes are located at successive half wavelengths from the end wall of the resonator, but at higher frequencies it may be advantageous to locate them at full wavelength intervals. Our experiments show that when the diode deviates by more than one-eighth of a wavelength from its preferred location at a current maximum, its power output drops vary rapidly; and if the diode is located an odd integral number of quarter wavelengths from the end wall of the resonator, its power will not add to that of the other diodes. Although the oscillator has been described as being used in conjunction with a coaxial cavity transmission line, it is clear that it could also be used with a waveguide transmission line.

The embodiment described is intended merely to be illustrative of the inventive concept. Various other embodiments and modifications may be made by those skilled in the art without departing from the spirit and scope of the invention.

What is claimed is:

1. An oscillator comprising:

an enclosure of conductive material defining therein a high frequency resonator having a terminated end and an output end from which high frequency output power is derived;

means extending through the interior of the enclosure between the terminated end and the output end for defining a conductive path;

a plurality of IMPATT diodes within the resonator being interconnected in series by said conductive path;

each of the diodes being located a distance D from the terminated end of the resonator which is within the ranges defined by $$D=\left(0 \text{ to } \tfrac{1}{8}\lambda,\ \tfrac{3}{8}\lambda \text{ to } \tfrac{5}{8}\lambda,\ \tfrac{7}{8}\lambda \text{ to } \tfrac{9}{8}\lambda \ldots \frac{3+4n}{8}\lambda \text{ to } \frac{5+4n}{8}\lambda\right)$$

where $\lambda$ is the wavelength at the frequency of operation of the oscillator and $n$ is an integral number;

and means for applying a bias voltage across the conductive path.

2. An oscillator comprising:

an enclosure of conductive material defining therein a high frequency resonator having a terminated end and an output end from which high frequency output power is derived;

means extending through the interior of the enclosure between the terminated and the output end for defining a conductive path;

a plurality of IMPATT diodes within the resonator being interconnected in series by said conductive path;

each of the diodes being located a distance D from the terminated end of the resonator which is within the ranges defined by $$D=\left(0 \text{ to } \tfrac{1}{8}\lambda, \tfrac{3}{8}\lambda \text{ to } \tfrac{5}{8}\lambda, \tfrac{7}{8}\lambda \text{ to } \tfrac{9}{8}\lambda \ldots \frac{3+4n}{8}\lambda \text{ to } \frac{5+4n}{8}\lambda\right)$$

where $\lambda$ is the wavelength at the frequency of operation of the oscillator and $n$ is an integral number;

each of the diodes being connected by a separate member of beryllium oxide to the enclosure, thereby providing structural support and efficient heat sinking for each diode, without any substantial modification of the electrical characteristics of the oscillator;

and means for applying a bias voltage across the conductive path.

3. The oscillator of claim 2 wherein:

the enclosure is cylindrical;

the diodes and the conductive path are substantially symmetrically disposed within the enclosure;

and the beryllium oxide members have an annular configuration with their outer peripheries being bonded to an inner surface of the enclosure.

4. The oscillator of claim 3 wherein:

the diodes are separated from each other by a distance which is substantially equal to an integral number of half wavelengths at the resonant frequency of the resonator.

5. The oscillator of claim 4 wherein:

the diodes are located within packages each having a compressible conductive bellows located at one end thereof, whereby successive diode packages can be successively mounted in the enclosure while forming said conductive path by abutting an end of the package against the conductive bellows of a preceding diode package.

6. The oscillator of claim 5 wherein:

the enclosure and the diode packages contained therein constitute a coaxial cable section;

said coaxial cable section abutting against a coaxial cable output transmission line for deriving radio-frequency energy from said resonator.

7. The oscillator of claim 6 wherein:

the diodes are separated from each other by a distance substantially equal to a half wavelength at the resonant frequency of the resonator.

References Cited

UNITED STATES PATENTS

| | | | |
|---|---|---|---|
| 3,246,256 | 4/1966 | Sommers. | |
| 3,252,112 | 5/1966 | Hauer | 307—322 X |
| 3,356,866 | 12/1967 | Misawa | 331—107 X |

ROY LAKE, Primary Examiner

S. H. GRIMM, Assistant Examiner

U.S. Cl. X.R.

307—322; 331—107; 333—80